United States Patent [19]

Omori

[11] 4,259,595
[45] Mar. 31, 1981

[54] CLOCKING SYSTEM FOR MOS TRANSISTOR LOGIC CIRCUIT

[75] Inventor: Ryozo Omori, Tenri, Japan

[73] Assignee: Sharp Kabushiki Kaisha, Osaka, Japan

[21] Appl. No.: 957,434

[22] Filed: Nov. 3, 1978

Related U.S. Application Data

[63] Continuation of Ser. No. 780,706, Mar. 24, 1977, abandoned.

[30] Foreign Application Priority Data

Mar. 24, 1976 [JP] Japan ................................. 51-34048

[51] Int. Cl.³ ........................................... H03K 19/096
[52] U.S. Cl. ...................................... 307/452; 307/269
[58] Field of Search ............... 307/205, 207, 208, 214, 307/215, 218

[56] References Cited

U.S. PATENT DOCUMENTS

| | | | |
|---|---|---|---|
| 3,518,451 | 6/1970 | Booher | 307/205 X |
| 3,551,693 | 12/1970 | Burns et al. | 307/205 |
| 3,631,261 | 12/1971 | Heimbigner | 307/205 X |
| 3,708,688 | 1/1973 | Yao | 307/205 |
| 3,733,471 | 5/1973 | Gilberg | 307/205 X |
| 3,829,710 | 8/1974 | Hirasawa et al. | 307/205 |
| 3,943,377 | 3/1976 | Suzuki | 307/215 X |
| 3,976,984 | 8/1976 | Hirasawa | 307/215 X |
| 3,999,081 | 12/1976 | Nakajima | 307/214 X |

Primary Examiner—Larry N. Anagnos
Attorney, Agent, or Firm—Birch, Stewart, Kolasch and Birch

[57] ABSTRACT

Three-phase ratioless MOS transistor circuits and complementary MOS inverter circuits are incorporated in an integrated circuit. The three-phase ratioless MOS transistor circuit includes a logic gate made of MOS transistors of one conductivity type.

2 Claims, 10 Drawing Figures

CLOCKING SYSTEM FOR MOS TRANSISTOR LOGIC CIRCUIT

This application is a continuation of copending application Ser. No. 780,706 filed on Mar. 24, 1977, now abandoned.

BACKGROUND AND SUMMARY OF THE INVENTION

The present invention relates to an MOS transistor logic circuit.

Recently, MOS integrated circuit techniques have been greatly advanced, and many types of logic circuits for use in an electronic calculator are made of complementary MOS transistors. However, it is not preferable that all circuit components are made of complementary MOS transistors. This is because the same number of P-channel MOS transistors and N-channel MOS transistors are required in the above-mentioned types of logic circuits and, hence, the LSI chip size becomes larger than necessary.

To reduce the chip size, clocked complementary MOS transistor circuits are proposed. However, the conventional clocked complementary MOS transistor circuits are not satisfactory, because the clock pulses are not effectively used in the conventional clocked complementary MOS transistor circuits and the logic circuit is made of the same number of P-channel MOS transistors and N-channel MOS transistors.

Accordingly, an object of the present invention is to provide an MOS transistor logic circuit of a small chip size.

Another object of the present invention is to provide an MOS transistor logic circuit, wherein clock pulses are effectively utilized.

Still another object of the present invention is to provide an MOS transistor logic circuit including a plurality of stages of logic gates, which can be driven by three-phase clock pulses.

Yet another object of the present invention is to provide an MOS transistor logic circuit of low power dissipation.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, three-phase ratioless MOS transistor circuits and complementary MOS inverter circuits are incorporated in an integrated MOS transistor logic circuit. The three-phase ratioless MOS transistor circuit includes a logic circuit made of MOS transistors of one conductivity type, whereby the chip size is greatly reduced.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

An MOS transistor logic circuit of the present invention is made of a combination of three-phase ratioless MOS transistor circuits and complementary MOS inverter circuits.

Figure 1:
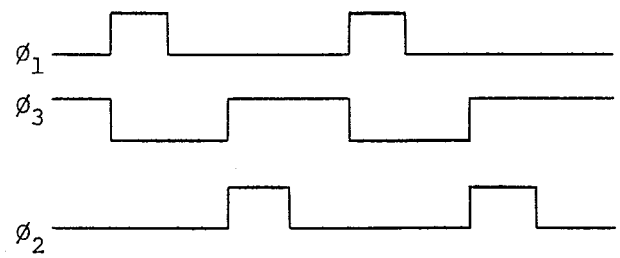
FIG. 1 is a time chart showing three clock pulses used in an embodiment of an MOS transistor logic circuit of the present invention.

FIG. 1 shows three-phase clock pulses $\phi_1$, $\phi_2$ and $\phi_3$ to be used in the MOS transistor logic circuit of the present invention. The clock pulse $\phi_3$ changes its logic value at the leading edges of the clock pulses $\phi_1$ and $\phi_2$. The MOS transistor logic circuit of the present invention requires the above-mentioned clock pulses $\phi_1$, $\phi_2$ and $\phi_3$, and inverted pulses $\bar{\phi}_1$ and $\bar{\phi}_2$.

Figure 2:
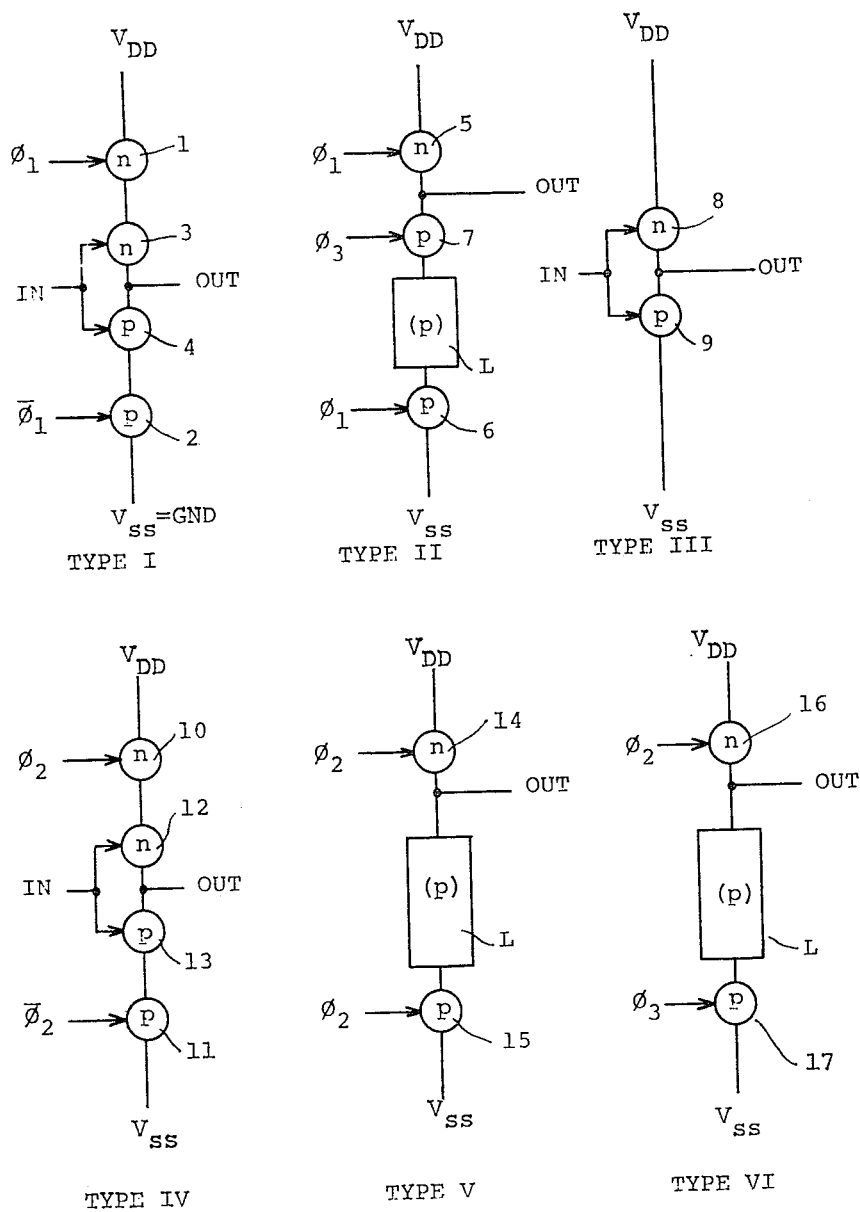
FIG. 2 is a circuit diagram of six (6) types of principal logic circuitry for forming the MOS transistor logic circuit of the present invention.

FIG. 2 shows six (6) types of principal logic circuitry for forming the MOS transistor logic circuit of the present invention. The circuitry mainly comprises a P-channel MOS transistor p and an N-channel MOS transistor n. The principal logic circuitry receives an input signal IN and develops an output signal OUT. TYPES II, V and VI include a logic gate L made of MOS transistors of one conductivity type. The logic gate L is, for example, an AND gate made of two P-channel MOS transistors which receive input signals, respectively.

The principal logic circuitry TYPE I comprises an N-channel MOS transistor 1 of which the gate electrode is connected to receive the clock $\phi_1$, a P-channel MOS transistor 2 of which the gate electrode is connected to receive the clock pulse $\bar{\phi}_1$, and a complementary inverter circuit including an N-channel MOS transistor 3 connected to the N-channel MOS transistor 1 and a P-channel MOS transistor 4 connected to the P-channel MOS transistor 2. The gate electrode of the complementary inverter circuit receives the input signal IN, and the drain electrode of the complementary inverter circuit develops the output signal OUT.

The principal logic circuitry TYPE II comprises an N-channel MOS transistor 5 of which the gate electrode is connected to receive the clock pulse $\phi_1$, a P-channel MOS transistor 6 of which the gate electrode is connected to receive the clock pulse $\bar{\phi}_1$, a P-channel MOS transistor 7 of which the gate electrode is connected to receive the clock pulse $\phi_3$, and a logic gate L. The logic gate L is interposed between the P-channel MOS transistor 7 and the P-channel MOS transistor 6. The output signal OUT is developed from the node provided between the N-channel MOS transistor 5 and the P-channel MOS transistor 7.

The principal logic circuitry TYPE III is a conventional complementary inverter circuit including an N-channel MOS transistor 8 and a P-channel MOS transistor 9. The input signal IN is applied to the gate electrode, and the output signal OUT is derived from the drain electrode of the complementary inverter circuit. The principal logic circuitry TYPE IV is similar to the TYPE I but is different from TYPE I by the clock pulses to be applied to. That is, the TYPE IV comprises an N-channel MOS transistor 10 receiving the clock pulse $\phi_2$, a P-channel MOS transistor 11 receiving the clock pulse $\bar{\phi}_2$, and a complementary inverter circuit disposed between the N-channel MOS transistor 10 and the P-channel MOS transistor 11. The complementary inverter circuit comprises an N-channel MOS transistor 12 and a P-channel MOS transistor 13, and receives the input signal IN to develop the output signal OUT.

The principal logic circuitry TYPE V comprises an N-channel MOS transistor 14 of which the gate electrode is connected to receive the clock pulse $\phi_2$, a P-channel MOS transistor 15 of which the gate electrode is connected to receive the clock pulse $\phi_2$, and a logic gate L interposed between the N-channel MOS transistor 14 and the P-channel MOS transistor 15. The output signal OUT is developed from the node provided between the N-channel MOS transistor 14 and the logic gate L.

The principal logic circuitry TYPE VI is a similar construction as the TYPE V, but a P-channel MOS transistor 17 receives the clock pulse $\phi_3$. That is, the TYPE VI comprises an N-channel MOS transistor 16 receiving the clock pulse $\phi_2$, a P-channel MOS transistor 17 receiving the clock pulse $\phi_3$, and the logic gate L interposed between the N-channel MOS transistor 16 and the P-channel MOS transistor 17.

Operation of the principal logic circuitry will be described with reference to FIG. 3.

TYPE I

The N-channel MOS transistor 1 receiving the clock pulse $\phi_1$ and the P-channel MOS transistor 2 receiving the clock pulse $\bar{\phi}_1$ are ON during a time period $\tau_1$ at which the clock pulse $\phi_1$ bears the high level ($V_{ss}$=GND). That is, the logic circuitry TYPE I is placed in the evaluate period during the time period $\tau_1$ (E represents the evaluate period in FIG. 3). The N-channel MOS transistor 1 and the P-channel MOS transistor 2 are OFF during a time period $\tau_2$ through $\tau_4$ at which the clock pulse $\phi_1$ bears the low level ($V_{DD}$). That is, the logic circuitry TYPE I is placed in the hold period during the time period $\tau_2$ through $\tau_4$ (H represents the hold period in FIG. 3).

TYPE II

Figure 3:
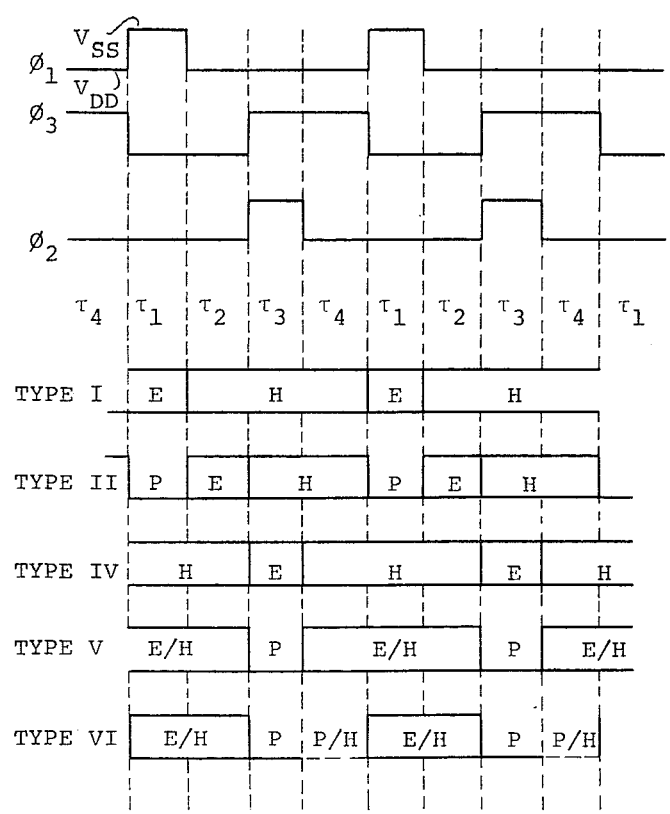
FIG. 3 is a time chart for explaining operation of the principal logic circuitry of FIG. 2.

The N-channel MOS transistor 5 receiving the clock pulse $\phi_1$ and the P-channel MOS transistor 7 receiving the clock pulse $\phi_3$ are ON during the time period $\tau_1$ at which the clock pulse $\phi_1$ bears the high level and the clock pulse $\phi_3$ bears the low level, whereby the logic circuitry TYPE II is placed in the precharge period (P represents the precharge period in FIG. 3). The clock pulses $\phi_1$ and $\phi_3$ take the low level during the time period $\tau_2$ and, hence, the P-channel MOS transistor 6 receiving the clock pulse $\phi_1$ and the P-channel MOS transistor 7 receiving the clock pulse $\phi_3$ are both ON during the time period $\tau_2$, whereby the TYPE II is placed in the evaluate period. During the time period $\tau_3$ to $\tau_4$ at which the clock pulse $\phi_1$ takes the low level and the clock pulse $\phi_3$ takes the high level, the N-channel MOS transistor 5 and the P-channel MOS transistor 7 are OFF, and the P-channel MOS transistor 6 is ON, whereby the TYPE II is placed in the hold period.

TYPE IV

The N-channel MOS transistor 10 receiving the clock pulse $\phi_2$ and the P-channel MOS transistor 11 receiving the clock pulse $\bar{\phi}_2$ are ON during the time period $\tau_3$ at which the clock pulse $\phi_2$ bears the high level, whereby the TYPE IV is placed in the evaluate period. The TYPE IV is placed in the hold period during the time periods $\tau_1$-$\tau_2$ and $\tau_4$ when the clock pulse $\phi_2$ bears the low level.

TYPE V

The principal logic circuitry TYPE V is placed in the precharge period during the time period $\tau_3$ at which the clock pulse $\phi_2$ bears the high level to conduct the N-channel MOS transistor 14. The principal logic circuitry TYPE V is placed in the hold period after evaluation during the time periods $\tau_4$ and $\tau_1$-$\tau_2$ at which the clock pulse $\phi_2$ takes the low level to conduct the P-channel MOS transistor 15 (E/H represents the hold period following the evaluation in FIG. 3).

TYPE VI

The TYPE VI is placed in the precharge period during the time period $\tau_3$ when the clock pulses $\phi_2$ and $\phi_3$ take the high level to conduct the N-channel MOS transistor 16. The precharged condition is held during the time period $\tau_4$ at which the N-channel MOS transistor 16 and the P-channel MOS transistor 17 are OFF because the clock pulse $\phi_2$ bears the low level and the clock pulse $\phi_3$ bears the high level (P/H represents the hold period following the precharge period in FIG. 3). The P-channel MOS transistor 17 is conducted during the time period $\tau_1$ to $\tau_2$ at which the clock pulses $\phi_2$ and $\phi_3$ take the low level, whereby the evaluated condition is held.

Figure 4:
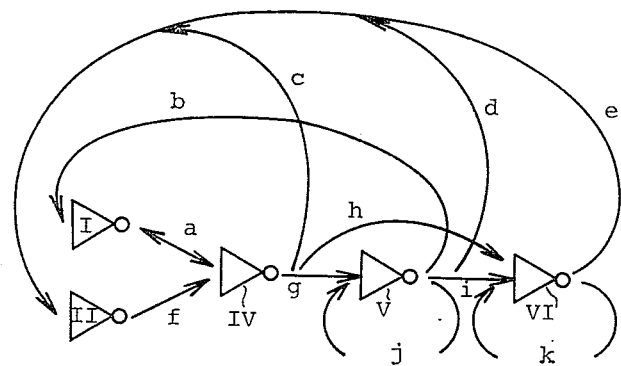
FIG. 4 is a block diagram showing combinations of the principal logic circuitry of FIG. 2.

The above-mentioned six (6) types of principal logic circuitry are combined with each other to form a desired unit of a logic circuit as shown in FIG. 4. Arrows a through k show directions of signal transmission.

The TYPE I can receive the output signals from the TYPE IV and the TYPE V, and can develop an output signal to apply to the input of TYPE IV. The TYPE II can receive the output signals of the TYPE IV, the TYPE V and the TYPE VI, and can develop the output signal to the TYPE IV. The TYPE IV can receive the output signals of the TYPE I and TYPE II, and can develop the output signals to the TYPE I, the TYPE II, the TYPE V and the TYPE VI.

The TYPE V can receive the output signal from the TYPE IV, and can develop the output signals toward the TYPE I, the TYPE II and the TYPE VI. Moreover, the output signal of the TYPE V can be applied to the TYPE V via an odd number of TYPE III. The TYPE VI can receive the output signals from the TYPE IV and the TYPE V, and can develop the output signal toward the TYPE II. Moreover, the output signals of the TYPE VI can be fed back to the TYPE VI through an odd number of TYPE III. A desired number of TYPE III (inclusive the odd number and the even number) can be interposed within the transmission lines a to i.

Figure 5:
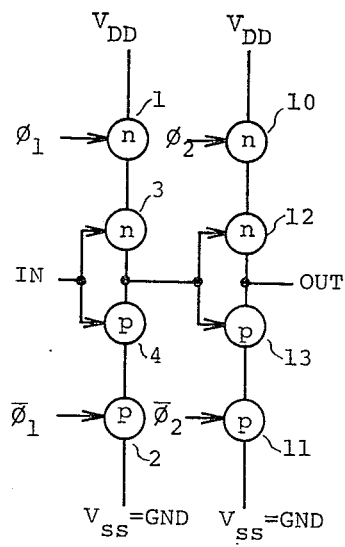
FIG. 5 is a circuit diagram of an example of the combinations shown in FIG. 4.

FIG. 5 shows an example of the combinations shown in FIG. 4. In this example, the TYPE IV is connected to receive the output signal of the TYPE I, whereby a shift register unit is formed.

Figure 6:
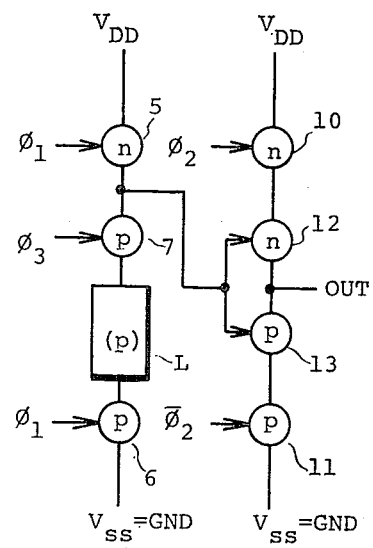
FIG. 6 is a circuit diagram of another example of the combinations shown in FIG. 4.

FIG. 6 shows another example of the combinations shown in FIG. 4, wherein the TYPE IV is connected to receive the output signal of the TYPE II. The combination of FIG. 6 is suited for constructing a multi-input flip-flop circuit, a static delayed flip-flop circuit, and an RS flip-flop circuit.

It will be clear that many types of logic circuits required in an electronic calculator, for example, an ROM and an RAM can be fabricated by combining the principal logic circuitry TYPE I through TYPE VI.

In fabricating the logic circuit, the phase relationship between the clock pulses $\phi_2$ and $\phi_3$ is preferably determined so that the leading edge of the clock pulse $\phi_3$ appears earlier than that of the clock pulse $\phi_2$.

Figure 7:
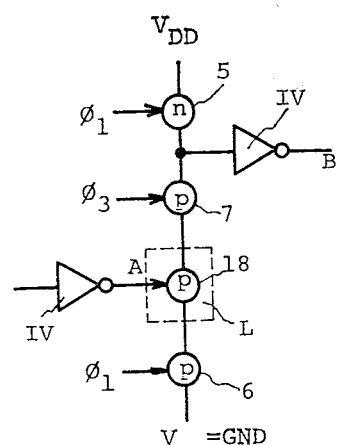
FIG. 7 is a circuit diagram of still another example of the combinations shown in FIG. 4.

Now consider still another example of the combinations as shown in FIG. 7. In this example, the output signal of the TYPE IV is applied to the TYPE II, and the output signal of the TYPE II is applied to the TYPE IV.

Figure 8:
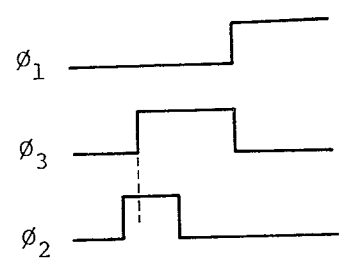
FIG. 8 is a time chart showing three clock pulses not suited for driving the example shown in FIG. 7.

The logic circuit L of the TYPE II includes a P-channel MOS transistor 18 of which the gate electrode is connected to receive the output signal of the TYPE IV positioned at the input side of the TYPE II. When the clock pulse $\phi_2$ takes the high level during a time period when the clock pulse $\phi_3$ still bears the low level as shown in FIG. 8, an output signal A of the input side TYPE IV changes from the high level to the low level in response to the clock pulse $\phi_2$ even though the P-channel MOS transistor 7 is still ON because the clock pulse $\phi_3$ still takes the low level. In this case, an output signal B of the output side TYPE IV changes from the high level to the low level without bit time delay.

In order to prevent the above-mentioned erroneous operation, the phase relationship between the clock pulses $\phi_2$ and $\phi_3$ should be determined in such a manner that the leading edge of the clock pulse $\phi_2$ will not appear earlier than that of the clock pulse $\phi_3$. However, in general, even when the clock pulses $\phi_2$ and $\phi_3$ have the leading edges occurring simultaneously, the above-mentioned erroneous operation will not occur. This is because the load connected to receive the clock pulse $\phi_2$ is greater than the load connected to receive the clock pulse $\phi_3$.

In fabricating the logic circuit, charge share should also be taken into account.

Figure 9:
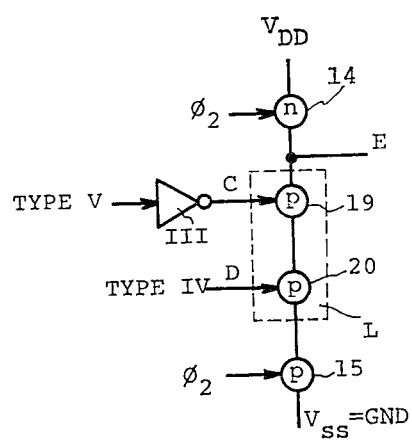
FIG. 9 is a circuit diagram of yet another example of the combinations shown in FIG. 4.

FIG. 9 shows an example of the combinations, wherein the charge share will occur. The logic gate L of the TYPE V comprises two P-channel MOS transistors 19 and 20. The P-channel MOS transistor 19 is connected to receive an output signal C of the TYPE III, which is connected to receive an output signal of the TYPE V. The P-channel MOS transistor 20 is connected to receive an output signal D of the TYPE IV.

Figure 10:
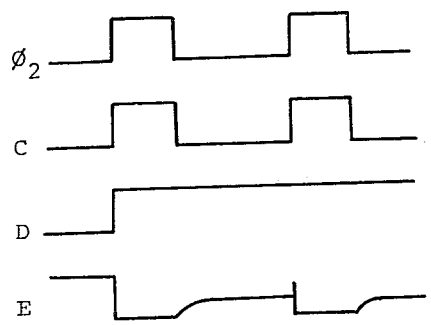
FIG. 10 is a time chart for explaining operation of the example shown in FIG. 9.

The charge share will be described with reference to a time chart of FIG. 10.

During a time period when the clock pulse $\phi_2$ takes the high level, the precharge is effected to the drain electrode of the P-channel MOS transistor 19 through the N-channel MOS transistor 14. Afterward, when the clock pulse $\phi_2$ and the output signal C change to the low levels, the N-channel MOS transistor 14 becomes OFF and the P-channel MOS transistor 19 is ON and, therefore, the charge share is conducted toward the drain electrode of the P-channel MOS transistor 20. Therefore, a potential level of an output signal E of this combination gradually increases during a time period when the output signal C takes the low level and the output signal D takes the high level.

One approach to eliminate the above-mentioned charge share is to exchange the P-channel MOS transistors 19 and 20. That is, the output signal C of the TYPE V-TYPE III should be applied to the gate electrode of the P-channel MOS transistor 20 shown in FIG. 9, and the output signal D of the TYPE IV should be applied to the gate electrode of the P-channel MOS transistor 19.

Another approach is to interpose a holding capacitor between an output terminal of the output signal E and the terminal $V_{SS}$.

In the foregoing embodiments the logic gate L is made of P-channel MOS transistors. However, the logic gate can be made of N-channel MOS transistors when the power supply level, polarities of the clock pulses, and the conductivity type of the respective MOS transistors are inverted. Moreover, a power-clocked logic circuit can be formed when desired clock pulses are used instead of the power sources $V_{DD}$ and $V_{SS}$.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A modular integrated circuit including a plurality of complementary MOS transistor switching circuits for performing a variety of logic functions comprising:

clock means for driving said switching circuits over a cycle including four consecutive time periods $T_1$ to $T_4$, said clock means including a first clock pulse train having a logic one in period $T_1$ and a logic zero in periods $T_2$, $T_3$, $T_4$, a second clock pulse train having a logic one in period $T_3$ and a logic zero in periods $T_1$, $T_2$, $T_4$ and a third clock pulse train having a logic one in periods $T_3$ and $T_4$ and a logic zero in periods $T_1$ and $T_2$, respectively, each of said clock pulse trains being periodic whereby each of said four consecutive time periods are successively reproduced in periodic form;

a type I circuit means responsive to said first clock pulse train, said type I circuit means including a complementary MOS inverter circuit coupled between the drain of a first N-channel MOS transistor and the drain of a first P-channel MOS transistor, the gate region of said first N-channel MOS transistor being responsive to said first clock pulse train, said first P-channel MOS transistor being responsive to an inverted version of said first clock pulse train;

a type II circuit means responsive to said first and third clock pulse trains, respectively, said type II circuit means including a second N-channel MOS transistor, the output terminal of said type II circuit means being connected to the drain region of said second N-channel MOS transistor, the gate region of said second N-channel transistor being responsive to said first clock pulse train, a first logic function circuit means connected on one end to the source region of a second P-channel MOS transistor for performing a gating function, said first logic function circuit means connected at its other end to the drain region of a third P-channel MOS transistor, the drain region of said second P-channel MOS transistor connected to the output terminal of said type II circuit means, said second P-channel MOS transistor being responsive to said third clock pulse train, said third P-channel MOS transistor being responsive to said first clock pulse train;

a type III circuit means for performing a NAND logic function, said type III circuit means capable of performing an OR and a NOR logic function, said type III circuit means comprising a complementary MOS inverter circuit;

a type IV circuit means including a complementary MOS inverter coupled to the drain region of a third N-channel MOS transistor on one end and to the drain region of a fourth P-channel MOS transistor, said third N-channel MOS transistor being responsive to said second clock pulse train, said fourth P-channel MOS transistor being responsive to an inverted version of said second clock pulse train;

a type V circuit means including a fourth N-channel MOS transistor responsive to said second clock pulse train, the output terminal of said type V being connected to the drain region of said fourth N-channel MOS transistor, a second logic function circuit means, including a fifth P-channel MOS transistor for performing an AND logic function, said second logic function circuit means capable of performing an OR logic function and being connected to the output terminal of said type V circuit means on one end and to the drain region of a sixth P-channel MOS transistor on the other end, said sixth P-channel MOS transistor being responsive to said second clock pulse train;

a type VI circuit means including a fifth N-channel MOS transistor responsive to said second clock pulse train, the drain region of said fifth N-channel transistor connected to an output terminal of said type VI circuit means, a third logic function circuit means including a seventh P-channel MOS transistor for performing an AND logic function, said third logic function circuit means capable of performing on OR and an AND-OR logic function, and being connected to the output terminal of said type VI circuit means on one end and to the drain region of an eighth P-channel transistor being responsive to a said third clock pulse train;

said type I circuit means connected to be driven by receipt of an output signal from said type IV circuit means and said type V circuit means;

said first logic function circuit means of said type II circuit means connected to be driven by receipt of an output signal from said type IV, said type V, and said type VI circuit means;

said type IV circuit means connected to be driven by receipt of an output signal from said type I and said type II circuit means;

said second logic function circuit means of said type V circuit means connected to be driven by receipt of an output from said type IV circuit means;

said third logic function circuit means of the type VI circuit means connected to be driven by receipt of an output signal from said type IV and said type V circuit means; and first and second ones of said type III circuit means connected to be driven by an output signal from said type V circuit means and said type VI circuit means, respectively, said first type III circuit means generating a first output signal, said second type III circuit means generating a second output signal, said second logic function circuit means of said type V circuit means connected to be driven by said first output signal, said third logic function circuit means of said type VI circuit means connected to be driven by said second output signal;

said clock means driving said type I-VI circuit means.

2. A complementary MOS transistor switching circuit in accordance with claim 1 wherein said P-channel MOS transistors are replaced with alternative N-channel MOS transistors, said N-channel MOS transistors being replaced with alternative P-channel MOS transistors, said clock pulse trains energizing said N-channel and P-channel MOS transistors, respectively, being inverted to energize said alternative N-channel and said alternative P-channel MOS transistors, respectively.

* * * * *